US009322884B2

(12) United States Patent
Luo et al.

(10) Patent No.: US 9,322,884 B2
(45) Date of Patent: Apr. 26, 2016

(54) IMPEDANCE ANALYZING DEVICE

(71) Applicant: INDUSTRIAL TECHNOLOGY RESEARCH INSTITUTE, Hsinchu (TW)

(72) Inventors: Yi-Feng Luo, Yilan County (TW); Cihun-Siyong Gong, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 515 days.

(21) Appl. No.: 13/891,882

(22) Filed: May 10, 2013

(65) Prior Publication Data

US 2013/0253862 A1 Sep. 26, 2013

Related U.S. Application Data

(63) Continuation-in-part of application No. 13/439,405, filed on Apr. 4, 2012, now abandoned.

(30) Foreign Application Priority Data

Jan. 6, 2012 (TW) .............................. 101100639 A
Jan. 4, 2013 (TW) .............................. 102100332 A

(51) Int. Cl.
*G01R 31/36* (2006.01)
*G01R 27/02* (2006.01)

(52) U.S. Cl.
CPC ............ *G01R 31/3662* (2013.01); *G01R 27/02* (2013.01); *G01R 31/3627* (2013.01); *G01R 31/3651* (2013.01); *G01R 31/3679* (2013.01); *G01R 31/3689* (2013.01)

(58) Field of Classification Search
CPC ........... G01R 31/3662; G01R 31/3627; G01R 31/3689; G01R 27/02; G01R 31/3651; G01R 31/3679
USPC .................... 702/63, 65; 706/2; 320/130, 134
See application file for complete search history.

(56) References Cited

U.S. PATENT DOCUMENTS

| | | | | |
|---|---|---|---|---|
| 5,159,272 A * | 10/1992 | Rao | ...................... | G01R 31/362 320/136 |
| 6,668,247 B2 * | 12/2003 | Singh | .................. | G01R 31/3651 320/130 |
| 7,051,008 B2 * | 5/2006 | Singh | .................. | G01R 31/3651 706/2 |
| 7,446,510 B2 * | 11/2008 | Chou | .................. | G01R 31/3679 320/156 |

(Continued)

FOREIGN PATENT DOCUMENTS

CN 101131417 A 2/2008
CN 101187697 A 5/2008

(Continued)

OTHER PUBLICATIONS

Chinese Office Action received from SIPO dated Dec. 3, 2014.

(Continued)

*Primary Examiner* — Carol S Tsai
(74) *Attorney, Agent, or Firm* — Locke Lord LLP; Tim Tingkang Xia, Esq.

(57) ABSTRACT

An impedance analyzing device, adapted to a testee comprising an electrode or at least one battery cell, includes a signal capturing unit, a signal adjusting unit, a signal analyzing unit, a processing unit, and a power source supply unit providing a variable-frequency voltage signal to the testee. The signal adjusting unit receiving and adjusts a variable-frequency voltage signal and the current signal to generate an adjusted variable-frequency voltage signal and an adjusted current signal. The signal capturing unit captures a current signal generated by the testee in response to the variable-frequency voltage signal. The signal analyzing unit receives and analyzes the adjusted variable-frequency voltage signal and the adjusted current signal in frequency domain to obtain a frequency domain parameter and/or a time domain parameter. The processing unit receives the frequency domain parameter and/or the time domain parameter to obtain an impedance variation characteristic of the testee.

5 Claims, 6 Drawing Sheets

(56) References Cited

U.S. PATENT DOCUMENTS

| | | | |
|---|---|---|---|
| 7,541,814 B2 * | 6/2009 | De Doncker | G01R 31/3662 324/426 |
| 7,788,052 B2 * | 8/2010 | Iwane | G01R 31/3679 320/132 |
| 7,847,557 B2 * | 12/2010 | Yun | G01R 31/3651 324/426 |
| 9,132,745 B1 * | 9/2015 | Lee | B60L 11/1861 |
| 2003/0085621 A1 | 5/2003 | Potega | |
| 2007/0001679 A1 | 1/2007 | Cho et al. | |
| 2007/0090843 A1 * | 4/2007 | De Doncker | G01R 31/3662 324/426 |
| 2008/0054848 A1 * | 3/2008 | Yun | G01R 31/3662 320/134 |

FOREIGN PATENT DOCUMENTS

| | | |
|---|---|---|
| CN | 101208847 A | 6/2008 |
| CN | 201352255 Y | 11/2009 |
| CN | 101834457 A | 9/2010 |
| CN | 1305590 A | 7/2011 |
| CN | 102116844 A | 7/2011 |
| CN | 102269798 A | 12/2011 |
| CN | 102292864 A | 12/2011 |

OTHER PUBLICATIONS

Dissertation for Doctor of Philosophy's Degree in Engineering, Research for Estimation of Residual Power NiMH Battery for Electronic Vehicles, China Academic Journal Electronic Publishing House, Sep. 2010, Classified Index U469.72, School Code 10213, UDC 681, Harbin Institute of Technology.

Chen Shou-Ping et al., Peculiarity Analysis and Proportion Management of Power Batteries, Chinese Battery Industry, Sep. 24 2003, pp. 265-271, vol. 8, No. 6, Ha'erbin Zhengda Automatization Equipment, Co., Ltd., Ha'erbin Heilongjiang 150080, China.

* cited by examiner

US 9,322,884 B2

IMPEDANCE ANALYZING DEVICE

CROSS-REFERENCE TO RELATED APPLICATIONS

This non-provisional application is a continuation-in-part patent application of U.S. application Ser. No. 13/439,405 filed on Apr. 4, 2012, which claims priority under 35 U.S.C. §119(a) on Patent Application No. 101100639 filed in Taiwan, R.O.C. on Jan. 6, 2012. This application also claims priority under 35 U.S.C. §119(a) on Patent Application No. 102100332 filed in Taiwan, R.O.C. on Jan. 4, 2013. The entire contents of the above disclosures are hereby incorporated by reference.

TECHNICAL FIELD

The disclosure relates to an impedance analysis technology, and more particularly to an impedance analyzing device.

BACKGROUND

With development of vehicle technology, interpersonal distance is reduced and human's life quality is improved. Vehicles drove by oil have an engine using liquid fuel. It is not difficult to measure the remaining amount of fuel in a vehicle. However, with awareness of environmental protection and in order to avoid excessive dependence on oil, people have focused on electric vehicles (EVs) which have low noise, low environmental pollution, easily controlled pollution sources, and diverse kinds of energy.

Generally, EVs are drove by electrical energy stored in a battery. A charge and discharge processes with large current often exit in EVs. It is not easy to accurately measure the remaining electrical quantity of a battery and thus it is very important to manage and analyze the battery. State of charge (SOC) and state of healthy (SOH) of a battery can be reflected by variation of internal impedance of a battery. Therefore, the SOC and SOH of a battery can be measured by direct current (DC) internal impedance and a temperature of the battery. The SOC shows the remaining electrical quantity of a battery. The SOH shows a state parameter of a battery, and the state parameter is a parameter quantifying the internal impedance variation of the battery resulting from ageing phenomenon. Therefore, a user may know an appropriate time to charge and replace a battery by checking the SOC and the SOH of the battery, respectively.

A method for checking the SOH of a battery mostly uses impedance tracking technology, i.e., using DC impedance and open circuit voltage to calculate the chemistry capacity of a battery and then with assistance of a look-up table estimating the SOC and SOH of the battery. Furthermore, the open circuit voltage is not measured when a battery is in off-line state, and thus the accuracy for the SOC and SOH obtained by means of look-up table is debatable. Actually, the open circuit voltage needs to be measured when a battery is idle or has a light load. Furthermore, only in a particular charge or discharge process the capacity of a battery can be updated. That is, information regarding the SOC and SOH of a battery cannot be obtained in real time. In view of above, there has been a key problem for how to obtain the internal parameters of a battery in a real time and thus deduce the SOC and SOH of the battery.

SUMMARY

An impedance analyzing device, adapted to a testee comprising an electrode or at least one battery cell, is provided according to an embodiment in the disclosure, which includes a power source supply unit, a signal capturing unit, a signal adjusting unit, a signal analyzing unit and a processing unit.

The power source supply unit provides a variable-frequency voltage signal to the testee. The variable-frequency voltage signal has a plurality of frequencies in a range between a first frequency and a second frequency. The signal capturing unit captures a current signal generated by the testee in response to the variable-frequency voltage signal. The signal adjusting unit is coupled to the power source supply unit and the signal capturing unit. The signal adjusting unit receives and adjusts the variable-frequency voltage signal and the current signal to generate an adjusted variable-frequency voltage signal and an adjusted current signal. The signal analyzing unit is coupled to the signal capturing unit, and receives and analyzes the adjusted variable-frequency voltage signal and the adjusted current signal in frequency domain to obtain at least one of a frequency domain parameter and a time domain parameter. The processing unit is coupled to the signal analyzing unit. The processing unit receives the at least one of the frequency domain parameter and the time domain parameter, and obtains an impedance variation characteristic of the testee according to the at least one of the frequency domain parameter and the time domain parameter.

BRIEF DESCRIPTION OF THE DRAWINGS

The present disclosure will become more fully understood from the detailed description given herein below for illustration only, and thus does not limit the present disclosure, wherein.

DETAILED DESCRIPTION

Figure 1:
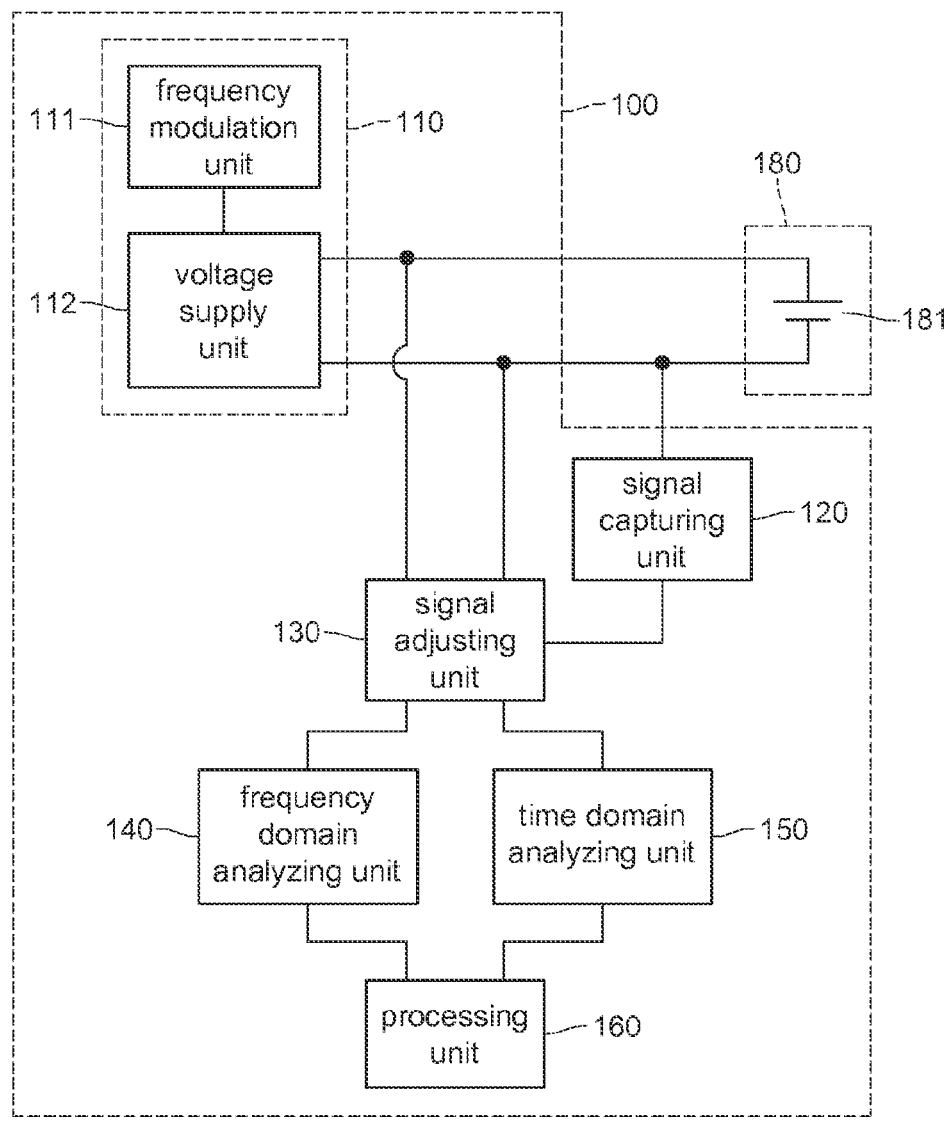
FIG. 1 is a block diagram for a battery analysis device according to the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the disclosure, a label is employed to describe the same elements or similar elements.

FIG. 1 is a block diagram for a battery analysis device according to the present disclosure. With reference to FIG. 1, the battery analysis device 100 in the embodiment is adapted to the battery module 180 including a battery cell 181. The battery analysis device 100 includes a power source supply unit 110, a signal capturing unit 120, a signal adjusting unit 130, a frequency domain analyzing unit 140, a time domain analyzing unit 150, and a processing unit 160.

The power source supply unit 110 is used to provide a variable-frequency voltage signal having a plurality of frequencies in a range between a first frequency and a second frequency to the battery cell 181. The first frequency is different from the second frequency. For example, the second frequency is greater than the first frequency.

For illustration, if the first frequency is 1 Hz and the second frequency is 100 Hz, then the variable-frequency voltage signal has multiple frequencies in the range between 1 Hz and 100 Hz. In an embodiment, the multiple frequencies are for example 1 Hz (the first frequency) to 100 Hz (the second frequency) in sequence. That is, the variable-frequency voltage signal has 100 frequencies with a frequency interval of 1 Hz. When the battery analysis device 100 starts to work, the power source supply unit 110 provides a variable-frequency voltage signal having the first frequency of 1 Hz to the battery cell 181 and then provides a variable-frequency voltage signal having the frequency of 2 Hz, 3 Hz, and so on until the second frequency of 100 Hz to the battery cell 181 by means of varying the frequency of the variable-frequency voltage signal with the frequency interval of 1 Hz at a time. In such a way, the battery cell 181 is disturbed.

In another embodiment, the variable-frequency voltage signal has multiple frequencies, for example, 1 Hz (the first frequency), 50 Hz, and 100 Hz (the second frequency) in sequence. That is, the variable-frequency voltage signal has three different frequencies with a frequency interval of 50 Hz. The number of frequencies of the variable-frequency voltage signal and the frequency interval may be adjusted according to a user's requirement but not limited thereto.

The signal capturing unit 120 is used to capture a current signal generated by the battery cell 181 in response to the variable-frequency voltage signal. In particular, after the batter cell 181 receives the variable-frequency voltage signal, the signal capturing unit 120 captures the current signal, for example, the amplitude and the phase of the current signal, generated by the battery cell 181 for subsequent operation.

The signal adjusting unit 130 connected to the power source supply unit 110 and the signal capturing unit 120 is used to receive and adjust the variable-frequency voltage signal and the current signal to output an adjusted variable-frequency voltage signal and an adjusted current signal. For example, the signal adjusting unit 130 may amplify the variable-frequency voltage signal and the current signal for subsequent analyzing operation.

The frequency domain analyzing unit 140 connected to the signal capturing unit 120 is used to receive and analyze in frequency domain the adjusted variable-frequency voltage signal and the adjusted current signal so as to obtain a frequency domain parameter. In the other hand, the time domain analyzing unit 150 connected to the signal capturing unit 120 is used to receive and analyze in time domain the adjusted variable-frequency voltage signal and the adjusted current signal so as to obtain a time domain parameter.

The processing unit 160 connected to the frequency domain analyzing unit 140 and the time domain analyzing unit 150 is used to obtain electrochemistry characteristics of the battery cell 181 according to the frequency domain parameter and the time domain parameter. The equivalent module for the battery cell 181 is shown as FIG. 2. Electrochemistry characteristics of the battery cell 181 may be deduced by the following equations (1) and (2).

$$\frac{V_{max}\sin(2\pi f_n t)}{I_n \sin(2\pi f_n t - \phi_n)} = Z_n \angle \phi_n \quad (1)$$

$$Z_n \angle \phi_n = R_n \pm jX_n \quad (2)$$

where $V_{max} \sin(2\pi f_n t)$ is the variable-frequency voltage signal, $I_n \sin(2\pi f_n t - \phi_n)$ is the current signal generated by the battery cell 181 in response to the variable-frequency voltage signal, $Z_n$ is an impedance value of the battery cell 181, $\phi_n$ is a phase, $R_n$ is the real part of $Z_n \angle \phi_n$ and $R_n$ may correspond to DC impedance $R_o$, electrode-electrolyte resistance $R_{ct}$, and Warburg impedance $Z_w$ for the equivalent module of the battery cell 181, $X_n$ is the imaginary part of $Z_n \angle \phi_n$ and $X_n$ may correspond to capacitance $C_d$, inductance $L_d$, and Warburg impedance $Z_w$ for the equivalent module of the battery cell 181, V is the ideal voltage of the battery cell 181, and n is a positive integer greater than or equal to 1 representing different cases with different frequencies.

For example, when n=1, it means that each parameter above is obtained by using the frequency value as 1 Hz (the first frequency), when n=2, it means that each parameter above is obtained by using the frequency value as 2 Hz, and the like until the case in which n=100. In this way, more internal parameters of the battery cell 181 can be achieved more accurately, so that the SOC and the SOH of the battery module 180 can be determined more accurately.

After obtaining the electrochemistry characteristics of the battery cell 181, the processing unit 160 can estimate the SOC and the SOH of the battery cell 181 according to the electrochemistry characteristics and a temperature signal (e.g., the temperature may be the environmental temperature measured when analyzing the battery cell 181). In such a way, a real-time online measurement can be achieved to estimate the SOC and the SOH of the battery module 180, without the assistance of a battery database. Also, the estimated SOC and SOH of the battery module 180 can be provided to the back-end system so that a user may replace a battery in time.

In this embodiment, the battery analysis device 100 may analyze the battery cell 181 of the battery module 180 in real time in an online manner and immediately provide the SOC and the SOH of the battery cell 181 so as to accelerate analyzing the battery module 180.

Figure 2:
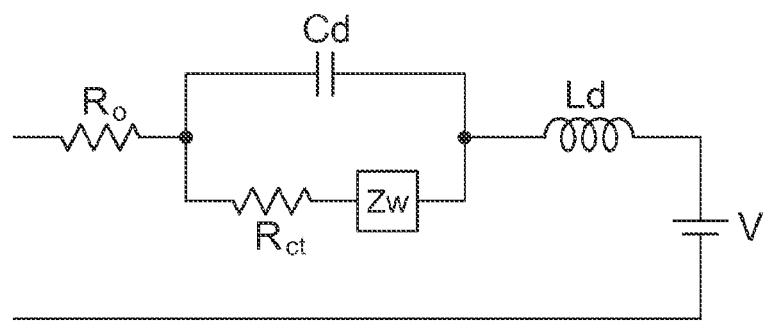
FIG. 2 is a block diagram for an equivalent module for a battery cell according to the present disclosure.

The equivalent module for the battery cell 181 shown in FIG. 2 is merely one example of this embodiment but not limited thereto. There are other equivalent examples according to this embodiment disclosed herein. Each example for the internal module of the battery cell 181 has equivalent DC impedance, electrode-electrolyte resistance $R_{ct}$, Warburg impedance $Z_w$, capacitance $C_d$, and inductance $L_d$.

In addition, the power source supply unit 110 includes a frequency modulation unit 111 and a voltage supply unit 112. The frequency modulation unit 111 is used to provide to multiple frequencies in a range between the first frequency and the second frequency. The voltage supply unit 112 connected to the frequency modulation unit 111 is used to provide the variable-frequency voltage signal according to the multiple frequencies.

Furthermore, the battery analysis device 100 can be configured on a chip by means of Integrated Circuit (IC) design or on any electronic devices (e.g., smart phone, tablet computer, and laptop) or electrical vehicles having a battery, so that the SOC and the SOH of the battery can be estimated in real time and thus a user may replace the battery in time.

Figure 3:
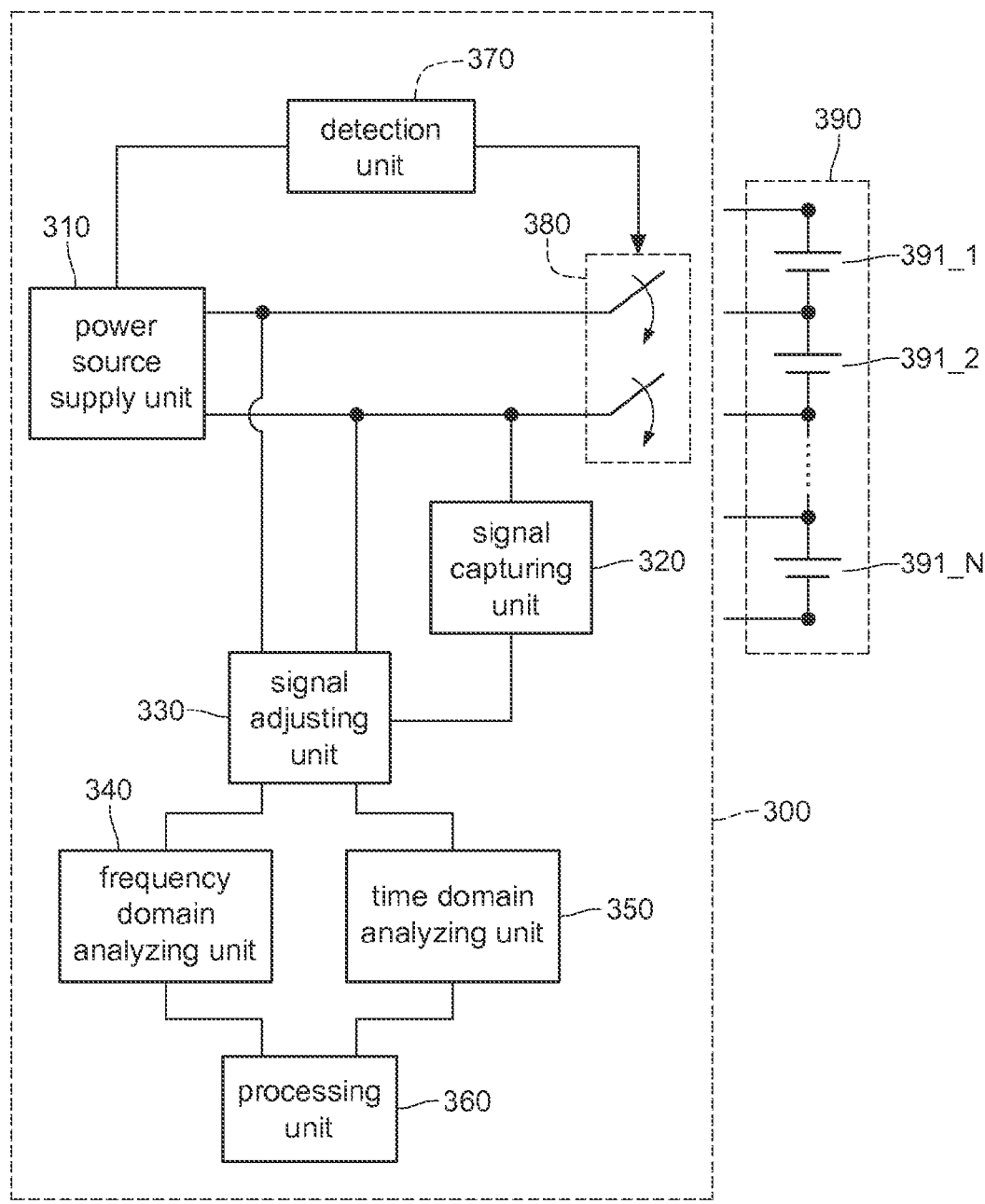
FIG. 3 a block diagram for another battery analysis device according to the present disclosure.

FIG. 3 is a block diagram for anther battery analysis device according to the present disclosure. With reference to FIG. 3, the battery analysis device 300 is adapted to a battery module 390 which have a plurality of battery cells 391_1 to 392_N, where N is a positive integer greater than 1. The battery analysis device 300 includes a power source supply unit 310, a signal capturing unit 320, a signal adjusting unit 330, a frequency domain analyzing unit 340, a time domain analyzing unit 350, a processing unit 360, a detection unit 370, and a switching unit 380.

In this embodiment, the operation and connection for the power source supply unit 310, the signal capturing unit 320, the signal adjusting unit 330, the frequency domain analyzing unit 340, the time domain analyzing unit 350, and the processing unit 360 may be referenced to those for the corresponding units shown in FIG. 2, and here will not be described again in detail. The internal structure and operation for the power source supply unit 310 may be referenced to that of the power source supply unit 110 shown in FIG. 1 (shown as the frequency modulation unit 111 and the voltage supply unit 112), and will not be described again in detail.

The detection unit 370 connected to the power source supply unit 310 is used to detect whether a frequency of the variable-frequency voltage signal is equal to the second frequency and thus output a detection signal. The switching unit 380 connected to the detection unit 370 and the power source supply unit 310 is used to sequentially switch the variable-frequency voltage signal to battery cells 391_1 to 391_N according to the detection signal.

For example, when the device 300 and the battery module 390 are connected to start an analyzing operation, the power source supply unit 310 provides the variable-frequency voltage signal with its frequency varying from the first frequency to the second frequency. For example, the frequency of the variable-frequency voltage signal is 1 Hz (the first frequency) to 100 Hz (the second frequency) in sequence. The switching unit 380 firstly switches the variable-frequency voltage signal to connect the battery cell 391_1 so as to provide the variable-frequency voltage signal to the battery cell 391_1. The battery cell 391_1 generates a required current signal in response to the variable-frequency voltage signal for subsequent operation.

Then the detection unit 370 detects whether a frequency of the variable-frequency voltage signal is equal to the second frequency (e.g., 100 Hz). If the detected frequency is not equal to the second frequency, it means that the variable-frequency voltage signal has not finished disturbing the battery cell 391_1 (i.e., the frequency has not varied to the second frequency from the first frequency). The detection unit 370 will not generate a detection signal to make the switching unit 380 keep connected with the battery cell 391_1.

At this time, the variable-frequency voltage signal continues varying. If a detected frequency of the variable-frequency voltage signal is equal to the second frequency, it means that the variable-frequency voltage signal has finished disturbing the battery cell 391_1. The detection unit 370 generates a detection signal to the switching unit 380. Then, the switching unit 380 switches the variable-frequency voltage signal to connect the battery cell 391_2 to provide the variable-frequency voltage signal to the cell 391_2. The battery cell 391_2 generates a required current signal in response to the variable-frequency voltage signal for subsequent operation.

Subsequently, if detecting that a frequency of the variable-frequency voltage signal is not equal to the second frequency, the detection unit 370 will not generate a detection signal to the switching unit 380 to make the switching unit 380 keep connected to the battery cell 391_2. Then, the frequency of the variable-frequency voltage signal continues to vary until getting to the second frequency. If detecting that a frequency of the variable-frequency voltage signal is equal to the second frequency, the detection unit 370 generates a detection signal to the switching unit 380. The switching unit 380 switches the variable-frequency voltage signal to connect the battery cell 391_3 and the cell 391_2 generates a required current signal in response to the variable-frequency voltage signal for subsequent operation. In such a way, all battery cells 391_1 to 391_N will generate corresponding required current signals according to the variable-frequency voltage signal until the switching unit 380 switches the variable-frequency voltage signal to connect the battery cell 391_N.

The signal capturing unit 320 sequentially captures the multiple current signals generated by battery cells 391_1 to 391_N in response to variable-frequency voltage signals. The signal adjusting unit 330 receives and adjusts variable-frequency voltage signals and the multiple current signals to generate adjusted variable-frequency voltage signals and adjusted current signals. The frequency domain analyzing unit 340 analyzes in frequency domain the adjusted variable-frequency voltage signals and adjusted current signals to obtain multiple frequency domain parameters. The time domain analyzing unit 350 analyzes in time domain the adjusted variable-frequency voltage signals and adjusted current signals to obtain multiple time domain parameters. Finally, the processing unit 360 obtains electrochemistry characteristics of battery cells 391_1 to 391_N according to the multiple time domain parameters and the multiple frequency domain parameters. Therefore, more internal parameters of battery cells 391_1 to 391_N can be achieved more accurately.

Then the processing unit 360 can estimate SOC and SOH of battery cells 391_1 to 391_N according to electrochemistry characteristics of battery cells 391_1 to 391_N and a temperature signal (e.g., the temperature may be an environmental temperature measured when analyzing the battery module 390). In such a way, even if batteries are idle or have a light load, a real-time online measurement can be achieved to estimate the SOC and the SOH of the battery module 390, without the assistance of a battery database. Also, the estimated SOC and SOH of the battery module 390 can be provided to the back-end system so that a user may replace a battery in time.

In this embodiment, the battery analysis device 300 may analyze battery cells 391_1 to 391_N of the battery module 390 in real time in an online manner and immediately provide SOC and SOH of battery cells 391_1 to 391_N so as to accelerate the analyzing.

Figure 4:
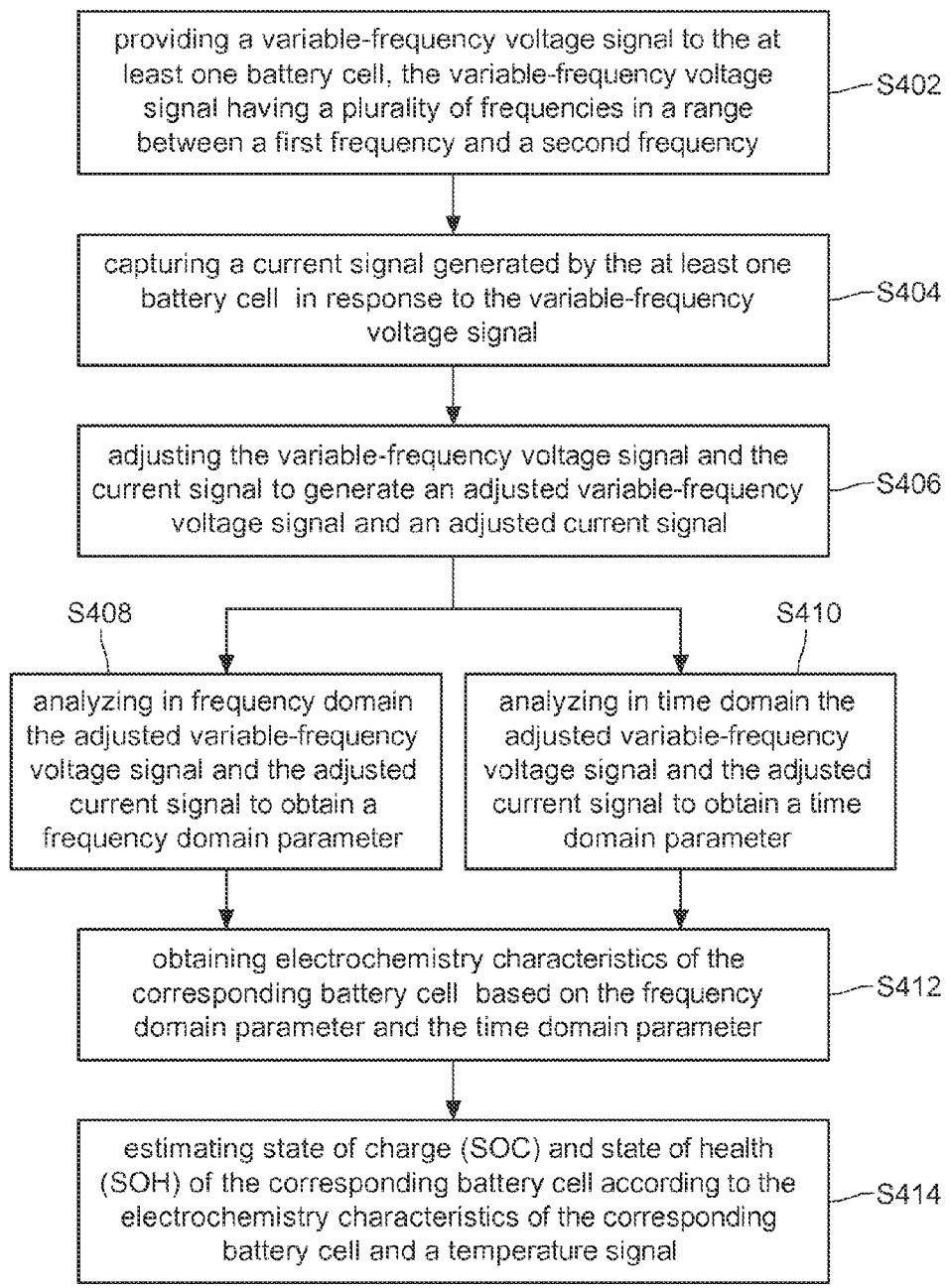
FIG. 4 a flowchart for a battery analysis method according to the present disclosure.

It can be concluded a battery analysis method according to the embodiment described with reference to FIG. 1. FIG. 4 is a flowchart for a battery analysis method. The method is adapted for a battery module comprising at least one battery cell. In the step S402, a variable-frequency voltage signal with multiple frequencies in a range between a first frequency and a second frequency is provided to a battery cell. In the step S404, a current signal generated in response to the variable-frequency voltage signal is captured.

In the step S406, the variable-frequency voltage signal and the current signal are adjusted to output the adjusted variable-frequency voltage signal and the adjusted current signal. In the step S408, the adjusted variable-frequency voltage signal and the adjusted current signal are analyzed in frequency domain to obtain frequency domain parameters. In the step S410, the adjusted variable-frequency voltage signal and the adjusted current signal are analyzed in time domain to obtain time domain parameters. In the step S412, electrochemistry characteristics of the battery cell are obtained according to the frequency domain parameters and the time domain parameters. In the step S414, the SOC and the SOH are estimated according to electrochemistry characteristics of the battery cell.

In this embodiment, the battery analysis method may analyze a battery cell of a battery module in real time in an online manner and immediately provide SOC and SOH of the battery cell so as to accelerate the analyzing.

Figure 5:
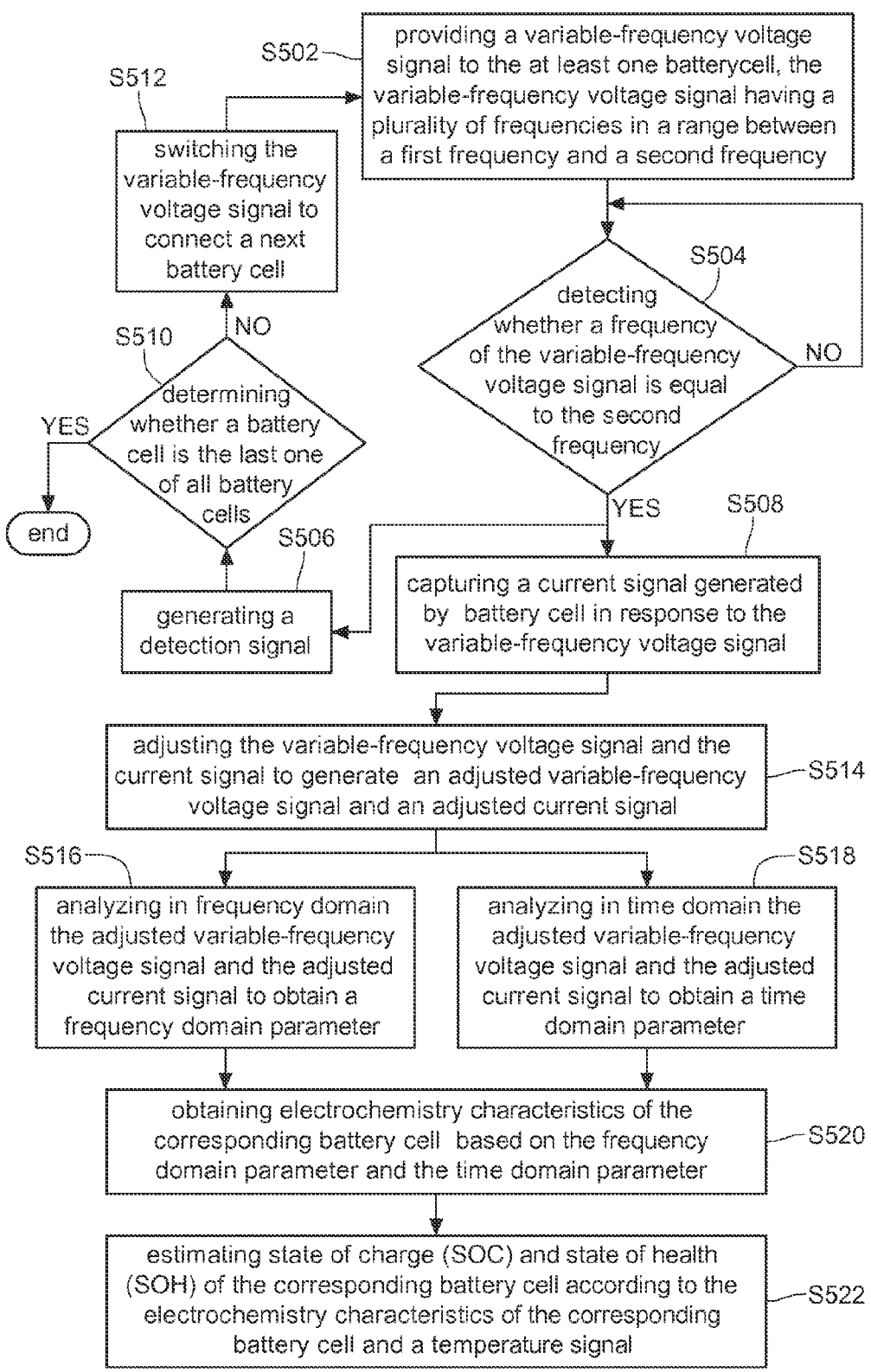
FIG. 5 is a flowchart for another battery analysis method according to the present disclosure.

It can be conducted another battery analysis method according to the embodiment described with reference to FIG. 2. FIG. 5 is a flowchart for another battery analysis method according to the present disclosure. The method in this embodiment is adapted for a battery module having multiple battery cells.

In the step 502, a variable-frequency voltage signal with multiple frequencies in a range between a first frequency and a second frequency is provided to battery cells. In the step S504, the frequency of the variable-frequency voltage signal is detected to determine whether the detected frequency is equal to the second frequency. If the detected frequency is not equal to the second frequency, the method goes to the step S504 to detect again whether the frequency of the variable-frequency voltage signal is equal to the second frequency until detecting that the frequency of the variable-frequency voltage signal is equal to the second frequency. Then, the method goes to the steps S506 and S508.

As described above, if detecting that the frequency of the variable-frequency voltage signal is equal to the second frequency, the process goes to the steps S506 and S508, so as to generate a detection signal and capture current signals generated by battery cells in response to variable-frequency voltage signals. The step S510 is performed after the step S506 to determine whether the current battery cell is the last one. If it is, the analyzing process ends. It means that analyzing operation for all battery cells in the battery module has finished. If it is not, the process goes to the step S512 to make the variable-frequency voltage signal switch to connect a next battery cell according to the detection signal. Then, the process returns to the step S502 to analyzing anther battery cell.

In the other hand, the step S514 is performed after the step S508 to adjust the variable-frequency voltage signal and the current signal to generate the adjusted variable-frequency voltage signal and the adjusted current signals. In the step S516, the adjusted variable-frequency voltage signal and the adjusted current signals are analyzed in frequency domain to obtain frequency domain parameters. In the Step S18, the adjusted variable-frequency voltage signal and the adjusted current signals are analyzed in time domain to obtain time domain parameters. In the step S520, electrochemistry characteristics of battery cells are obtained according to the frequency domain parameters and the time domain parameters. In the step S522, SOC and SOH of battery cells are estimated according to the electrochemistry characteristics and a temperature signal.

In such a way, the battery analysis method may use online measurements in real time to obtain the internal parameters of each battery cell of a battery module, and thus improve the accuracy of battery analysis.

In this embodiment, the battery analysis method may analyze battery cells of a battery module in real time in an online manner and provide immediately SOC and SOH of battery cells so as to accelerate the analyzing.

Figure 6:
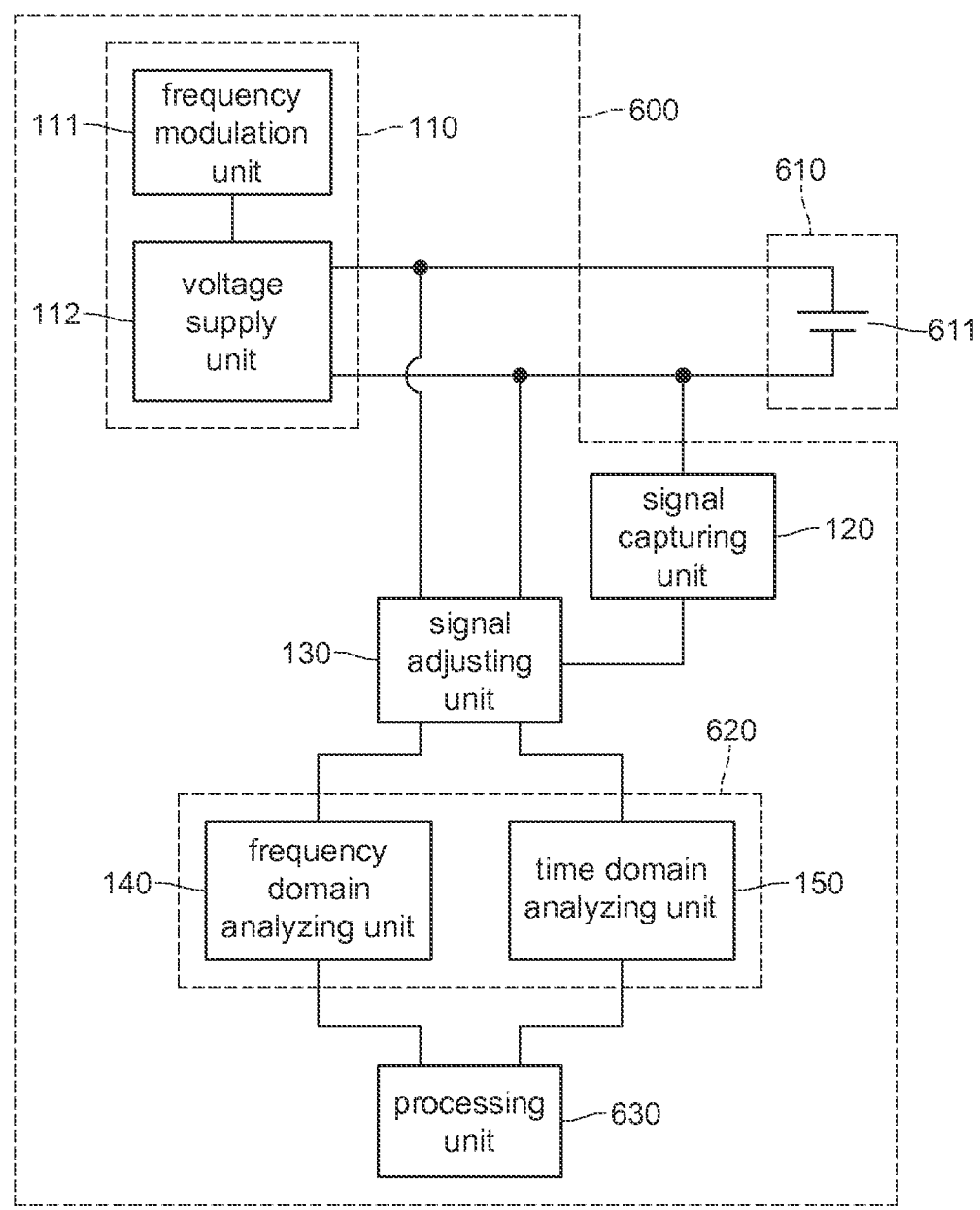
FIG. 6 is a block diagram for an impedance analyzing device in the disclosure.

FIG. 6 is a block diagram of an impedance analyzing device in the disclosure. In this embodiment, the impedance analyzing device 600 is adapted to a testee 610. The testee 610 includes, for example, an electrode 611 as shown in FIG. 6, or a battery cell 181 in a battery module 180 as shown in FIG. 1. The electrode 611 can be an electrode for biomedical science. The electrode 611 can be used for contacting a human body, to measure impedance variation of the electrode 611 via the impedance analyzing device 600, so that the abnormal tissue variation of human body can be learned.

The impedance analyzing device 600 includes a power source supply unit 110, a signal capturing unit 120, a signal adjusting unit 130, a signal analyzing unit 620 and a processing unit 630. The power source supply unit 110 supplies a variable-frequency voltage signal to the testee 610, i.e. the electrode 611 or the battery cell 181 of the battery module 180. The variable-frequency voltage signal has a plurality of frequencies in a range between a first frequency and a second frequency. The first frequency and the second frequency are different. For example, the second frequency is higher than the first frequency. The operation of the power source supply unit 110 can refer to the description in FIG. 1, thereby being not described herein again.

The signal capturing unit 120 captures a current signal generated by the testee 610, i.e. the electrode 611 or the battery cell 181 of the battery module 180, in response to the variable-frequency voltage signal. In other words, the testee 610, i.e. the electrode 611 or the battery cell 181 of the battery module 180, generates the current signal after receiving the variable-frequency voltage signal. The signal capturing unit 120 further extracts the content, for example, phases and amplitudes, in the current signal generated by the testee 610, i.e. the electrode 611 or the battery cell 181 of the battery module 180, so as to the subsequent operation.

The signal adjusting unit 130 is coupled to the power source supply unit 110 and the signal capturing unit 120. The signal adjusting unit 130 receives and adjusts the variable-frequency voltage signal and the current signal to generate an adjusted variable-frequency voltage signal and an adjusted current signal.

The signal analyzing unit 620 is coupled to the signal capturing unit 120. The signal analyzing unit 620 receives the adjusted variable-frequency voltage signal and the adjusted current signal, and analyzes the adjusted variable-frequency voltage signal and the adjusted current signal in at least one of frequency and time domains to obtain at least one of a frequency domain parameter and a time domain parameter.

Specifically, the signal analyzing unit 620 can include at least one of a frequency domain analyzing unit 140 and a time domain analyzing unit 150, so as to analyze the adjusted variable-frequency voltage signal and the adjusted current signal in at least one of frequency and time domains and to obtain the at least one of the frequency domain parameter and the time domain parameter.

The processing unit 630 is coupled to the signal analyzing unit 620. The processing unit 630 receives the at least one of the frequency domain parameter and the time domain parameter to impedance variation characteristics corresponding to the testee 610. An equivalent module of the testee 610, i.e. the electrode 611 or the battery cell 181 of the battery module 180, can refer to FIG. 2. Electrochemistry characteristics of the electrode 611 can be deduced by the equations (1) and (2).

In the equations (1) and (2), $V_{max} \sin(2\pi f_n t)$ indicates the variable-frequency voltage signal, $I_n \sin(2\pi f_n t - \phi_n)$ indicates the current signal generated by the electrode 611 in response with the variable-frequency voltage signal, $Z_n$ is an impedance of the electrode 611, $\phi_n$ is a phase angle, $R_n$ is a real part of $Z_n \angle \phi_n$ and corresponds to a DC impedance $R_o$, an electrode-electrolyte resistance $R_{ct}$ and a Warburg impedance $Z_w$ of the equivalent module of the electrode 611, $X_n$ is an imaginary part of $Z_n \angle \phi_n$ and corresponds to a capacitor $C_d$, an inductor $L_d$ and the Warburg impedance $Z_w$ of the equivalent module of the electrode 611, V is an ideal voltage of the electrode 611, and n is a positive integer greater than or equal to 1 representing different cases with different frequencies.

In this way, more internal parameters corresponding to the electrode 611 may be more accurate, so that the states of the electrode 611 may be determined more accurately.

In this embodiment, the impedance analyzing device 600 may analyze the testee 610, i.e. the battery cell 181 of the battery module 180, in real time in an online manner, and immediately provide the states of the testee 610, so as to accelerate analyzing the testee 610.

Furthermore, the impedance analyzing device 600 can be embodied in a chip by an IC design.

Moreover, when the testee 610 is the battery cell 181 of the battery module 180, the impedance analyzing device 600 can be disposed on any electronic device with batteries (e.g. a smart phone, a tablet computer, or a notebook) or on an electric vehicle, so as to efficiently estimate the SOC and SOH states for a battery in real time. In this way, a user may learn the usage state of battery in real time and replace batteries in suitable time.

When the testee 610 is the electrode 611, the impedance analyzing device 600 can be disposed on a human body in an invasive way or a non-invasive way, so as to efficiently and accurately estimate the variation of human body, e.g. the tissue variation, in real time. Accordingly, the user can realize the health states of self in real time.

Figure 7:
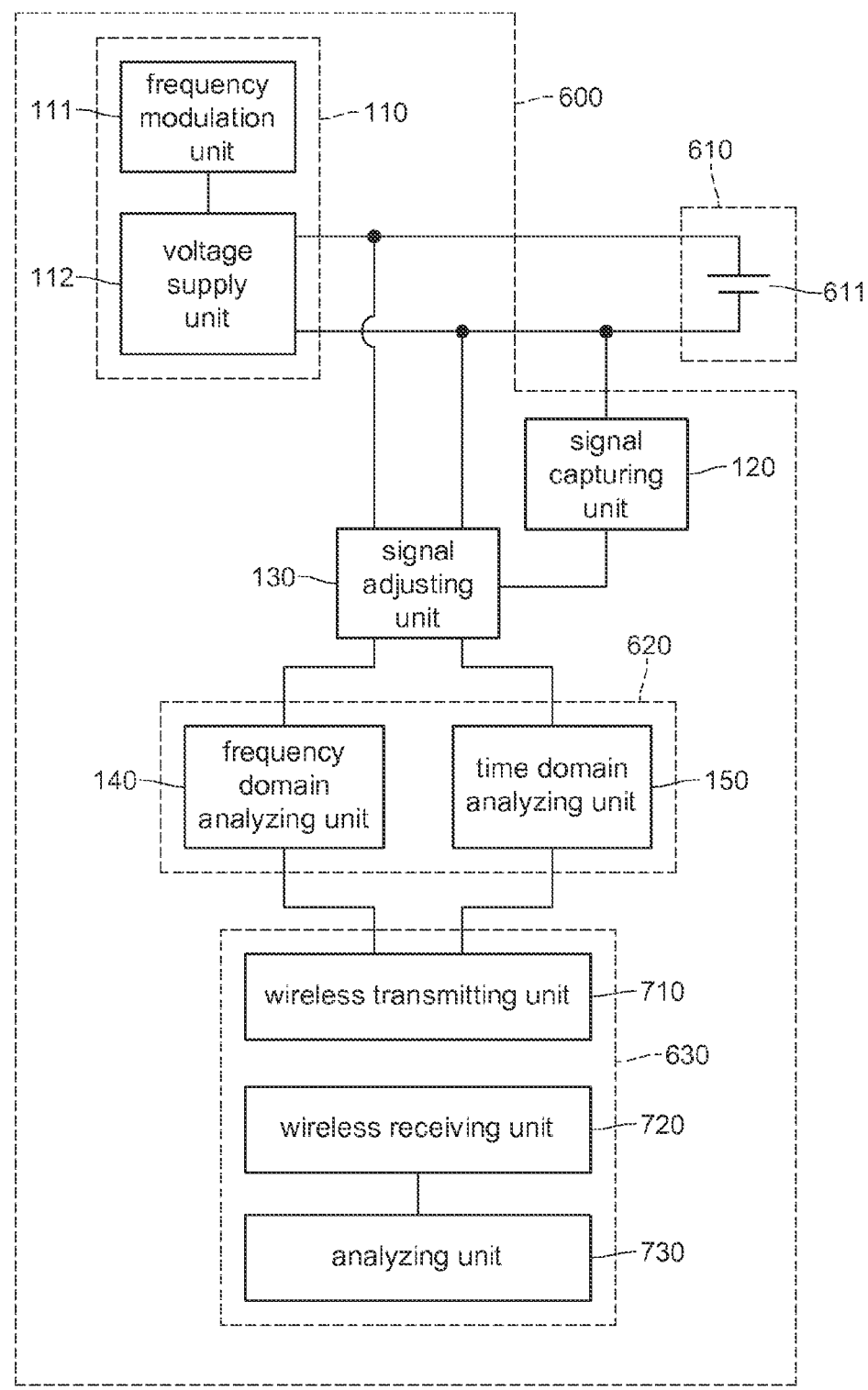
FIG. 7 is a block diagram of an impedance analyzing device according to another embodiment in the disclosure.

Specifically, the processing unit 630 includes a wireless transmitting unit 710, a wireless receiving unit 720 and an analyzing unit 730 in FIG. 7. The wireless transmitting unit 710 is coupled to the signal analyzing unit 620. The wireless transmitting unit 710 receives the at least one of the frequency domain parameter and the time domain parameter, converts the at least one of the frequency domain parameter and the time domain parameter into a wireless signal, and transmits the wireless signal. The wireless receiving unit 720 receives the wireless signal the transmitted by the wireless transmitting unit 710.

In this embodiment, the wireless transmitting unit 710 and the wireless receiving unit 720 can perform the receiving and transmission of signal through WIFI, WIMAX or other wireless communication protocols. The analyzing unit 730 is coupled to the wireless receiving unit 720. The analyzing unit 730 receives the wireless signal, converts the wireless signal to extract the at least one of the frequency domain parameter and the time domain parameter, and according to the at least one of the frequency domain parameter and the time domain parameter, extracts the impedance variation characteristics corresponding to the testee 610.

In an embodiment, when the impedance analyzing device 600 is disposed in a human body in the invasive way, the power source supply unit 110, the signal capturing unit 120, the signal adjusting unit 130, the signal analyzing unit 620 and the wireless transmitting unit 710 of the processing unit 630 can be embodied in a chip, and then is disposed in the human body and is coupled to the electrode 611. The chip acquires the wireless signal which has the at least one of the frequency domain parameter and the time domain parameter and is transmitted by the wireless transmitting unit 710, via the wireless receiving unit 720 in a wireless manner. The analyzing unit 730 further analyzes the acquired information in real time and generates a corresponding analysis result. Thus, the impedance variation characteristics of the electrode 611 may be efficiently obtained for a real time analysis, and the tissue variation of human body can be learned.

In an embodiment, when the impedance analyzing device 600 is disposed in the human body in the non-invasive way, besides the foregoing wireless manner, the processing unit 630 can also be coupled to the signal analyzing unit 620 in a wired way to acquire the at least one of the frequency domain parameter and the time domain parameter for the corresponding analysis. In this way, the impedance analyzing device 600 can acquire the SOC and SOH states of the battery cell 181 and further apply such information to the biomedical science. In other words, the impedance variation of the electrode 611 in a human body can be acquired for a real time analysis, so that the tissue variation of human body can be learned.

The battery analysis device, the method thereof and the impedance analyzing device according to the disclosure provide a variable-frequency voltage signal having frequencies in a range between the first frequency and the second frequency to a testee, i.e. an electrode or at least battery cell of the battery module. The testee generates current signals in response to the variable-frequency voltage signal. The current signals and the variable-frequency voltage signal are analyzed in at least one of frequency domain and time domain to obtain impedance variation characteristics, i.e. the internal parameters of battery or electrode. According to the internal parameters and the current temperature, the SOC and SOH of a battery are estimated. In this case, even if a battery is idle or has a light load, real time online measurements and more internal parameters can be achieved to estimate the state variation of the testee, e.g. the states of the electrode or the SOC and the SOH of the battery cell, without a testee database. Furthermore, the method and device can provide the states of the testee, e.g. the states of the electrode or the SOC and the SOH of the battery cell, for users to know the usage condition of the battery and the health state of self more accurately and replace a battery in time.

What is claimed is:

1. An impedance analyzing device, adapted to a testee comprising an electrode or at least one battery cell, the impedance analyzing device comprising:

a power source supply unit, for providing a variable-frequency voltage signal to the testee, the variable-frequency voltage signal having a plurality of frequencies in a range between a first frequency and a second frequency;

a signal capturing unit, for capturing a current signal generated by the testee in response to the variable-frequency voltage signal;

a signal adjusting unit, coupled to the power source supply unit and the signal capturing unit, for receiving and adjusting the variable-frequency voltage signal and the current signal to generate an adjusted variable-frequency voltage signal and an adjusted current signal;

a signal analyzing unit, coupled to the signal capturing unit, for receiving and analyzing the adjusted variable-frequency voltage signal and the adjusted current signal in frequency domain to obtain at least one of a frequency domain parameter and a time domain parameter; and a processing unit, coupled to the signal analyzing unit, for receiving the at least one of the frequency domain parameter and the time domain parameter, and for obtaining an impedance variation characteristic of the testee according to the at least one of the frequency domain parameter and the time domain parameter.

2. The impedance analyzing device according to claim 1, wherein the processing unit further estimates state of charge (SOC) and state of health (SOH) of the at least one battery cell according to an electrochemistry characteristic of the battery cell and a temperature signal.

3. The impedance analyzing device according to claim 1, wherein the impedance analyzing device analyzes the testee in real time in an online manner.

4. The impedance analyzing device according to claim 1, wherein the impedance analyzing device is embodied on a chip by an Integrated Circuit (IC) design, and is disposed on a user or an electronic device having batteries.

5. The impedance analyzing device according to claim 1, wherein the processing unit comprises:
   a wireless transmitting unit, coupled to the signal analyzing unit, for receiving the at least one of the frequency domain parameter and the time domain parameter, for converting the at least one of the frequency domain parameter and the time domain parameter into a wireless signal, and for transmitting the wireless signal;
   a wireless receiving unit, for receiving the wireless signal; and
   an analyzing unit, coupled to the wireless receiving unit, for receiving the wireless signal, converting the wireless signal to extract the at least one of the frequency domain parameter and the time domain parameter, and according to the at least one of the frequency domain parameter and the time domain parameter, obtaining an electro-chemistry characteristic corresponding to the testee.

* * * * *